United States Patent
Sasaki et al.

(10) Patent No.: US 10,748,563 B2
(45) Date of Patent: Aug. 18, 2020

(54) SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 52 days.

(21) Appl. No.: 16/222,009

(22) Filed: Dec. 17, 2018

(65) Prior Publication Data

US 2019/0206431 A1 Jul. 4, 2019

(30) Foreign Application Priority Data

Dec. 28, 2017 (JP) ................. 2017-252908

(51) Int. Cl.
*G11C 11/16* (2006.01)
*H01L 43/04* (2006.01)
*G11B 5/39* (2006.01)
*G11C 5/00* (2006.01)

(52) U.S. Cl.
CPC .............. *G11B 5/3903* (2013.01); *G11C 5/00* (2013.01)

(58) Field of Classification Search
CPC ..... H01L 27/222; H01L 29/82; H01L 27/105; H01L 27/228; G11C 11/161; G11C 11/18; G11C 11/1659; G11C 11/16; G11C 11/5607
See application file for complete search history.

(56) References Cited

U.S. PATENT DOCUMENTS

| | | | |
|---|---|---|---|
| 3,930,241 A | 12/1975 | Guarnieri et al. | |
| 8,350,347 B2 | 1/2013 | Gaudin et al. | |
| 2004/0257192 A1* | 12/2004 | Mori | H01L 43/08 428/692.1 |
| 2010/0176472 A1* | 7/2010 | Shoji | B82Y 25/00 257/421 |
| 2014/0056060 A1 | 2/2014 | Khvalkovskiy et al. | |

(Continued)

FOREIGN PATENT DOCUMENTS

| | | |
|---|---|---|
| JP | S51-051795 A | 5/1976 |
| JP | 2005-142508 A | 6/2005 |

(Continued)

OTHER PUBLICATIONS

I.M.Miron et al., "Perpendicular switching of a single ferromagnetic layer induced by in-plane current injection;" Nature, 476, 189 (2011).

(Continued)

*Primary Examiner* — Hien N Nguyen
(74) *Attorney, Agent, or Firm* — Oliff PLC

(57) ABSTRACT

A magnetoresistance effect element has a structure in which a first ferromagnetic layer, a non-magnetic layer, and a second ferromagnetic layer are subsequently laminated and outer circumferential portions of the first ferromagnetic (Continued)

layer, the non-magnetic layer, and the second ferromagnetic layer are covered with a first insulating film which contains silicon nitride as a main component and has boron nitride or aluminum nitride further added thereto.

20 Claims, 5 Drawing Sheets

(56) References Cited

U.S. PATENT DOCUMENTS

| | | | |
|---|---|---|---|
| 2014/0367814 A1* | 12/2014 | Ohmori | H01L 43/12 257/421 |
| 2015/0036415 A1 | 2/2015 | Di Pendina et al. | |
| 2015/0213868 A1 | 7/2015 | Wu et al. | |
| 2015/0348606 A1 | 12/2015 | Buhrman et al. | |
| 2017/0077177 A1 | 3/2017 | Shimomura et al. | |
| 2017/0222135 A1 | 8/2017 | Fukami et al. | |

FOREIGN PATENT DOCUMENTS

| | | |
|---|---|---|
| JP | 2014-045196 A | 3/2014 |
| JP | 2016-042527 A | 3/2016 |
| JP | 2017-059679 A | 3/2017 |
| JP | 2017-510016 A | 4/2017 |
| WO | 2016/021468 A1 | 2/2016 |
| WO | 2016-159017 A1 | 10/2016 |

OTHER PUBLICATIONS

S.Fukami et al., "A spin-orbit torque switching scheme with collinear magnetic easy axis and current configuration;" Nature Nanotechnology, DOI:10.1038/NNANO.2016.29, 2016.

Y.K.Kato et al., "Observation of the Spin Hall Effect in Semiconductors;" Science, 306, 1910, 2004.

L.Lui et al., "Spin torque switching with the giant spin Hall effect of tantalum;" Science, 336, 555, 2012.

L.Liu et al., "Current-Induced Switching of Perpendicularly Magnetized Magnetic Layers Using Spin Torque from the Spin Hall Effect;" Physical Review Letters, 109, 096602, 2012.

KS. Lee et al., "Threshold current for switching of a perpendicular magnetic layer induced by spin Hall effect;" Applied Physics Letters, 102, 112410, 2013.

KS. Lee et al., "Thermally activated switching of perpendicular magnet by spin-orbit torque;" Applied Physics Letters, 104, 072413, 2014.

S.Fukami et al., "Magnetization switching by spin-orbit torque in an antiferromagnet-ferromagnet bilayer system;" Nature materials, 15, 535, 2016.

S. Takahashi et al., "Spin injection and detection in magnetic nanostructures;" Physical Review B 67, 052409 (2003).

Y. Seo et al., "Area-Efficient SOT-MRAM With a Schottky Diode;" IEEE Electron Device Letters, vol. 37, No. 8, p. 982 (2016).

W. Zhang et al., "Spin Hall Effects in Metallic Antiferromagnets;" Physical Review Letters, 113, 196602 (2014).

* cited by examiner

SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

BACKGROUND OF THE DISCLOSURE

Field of the Disclosure

The present disclosure relates to a spin-orbit-torque magnetization rotational element, a spin-orbit-torque magnetoresistance effect element, and a magnetic memory.

Priority is claimed on Japanese Patent Application No. 2017-252908, filed on Dec. 28, 2017, the content of which is incorporated herein by reference.

Description of Related Art

Giant magnetoresistance (GMR) elements formed of multilayer films, i.e., ferromagnetic layers and non-magnetic layers, and tunneling magnetoresistance (TMR) elements using insulating layers (tunnel barrier layers or barrier layers) as non-magnetic layers are known. GMR element and TMR elements have attracted attention as elements for magnetic sensors, high frequency components, magnetic heads, and nonvolatile random access memories (MRAMs).

In an MRAM, data is read and written using a characteristic in which an element resistance of a GMR element or a TMR element changes when magnetization directions of two ferromagnetic layers sandwiching an insulating layer change. As writing methods for MRAMs, a method in which writing (magnetization rotation) is performed using a magnetic field produced by a current and a method in which writing (magnetization rotation) is performed using a spin transfer torque (STT) occurring when a current flows in a lamination direction of a magnetoresistance effect element are known.

The magnetization rotation of a magnetoresistance effect element using an STT requires a current to flow in a lamination direction of the magnetoresistance effect element when data is written. A writing current deteriorates the characteristics of a magnetoresistance effect element in some cases.

Thus, in recent years, attention has been paid to methods in which a current may not be required to flow in a lamination direction of a magnetoresistance effect element at the time of writing. One such method is a writing method using spin orbit torque (SOT) (for example, I. M. Miron, K. Garello, G Gaudin, P.-J. Zermatten, M. V. Costache, S. Auffret, S. Bandiera, B. Rodmacq, A. Schuhl, and P. Gambardella, Nature, 476, 189 (2011)). The SOT is induced due to a pure spin current generated due to a spin orbit interaction or a Rashba effect at an interface between different materials. A current for inducing the SOT in the magnetoresistance effect element flows in a direction intersecting a lamination direction of the magnetoresistance effect element. That is to say, it is not necessary to flow a current in the lamination direction of the magnetoresistance effect element and the magnetoresistance effect element is expected to have a long lifespan.

On the other hand, in the case of magnetization rotation using an SOT, it is necessary to assist magnetization rotation using an external magnetic field in accordance with a constitution of an element (for example, S. Fukami, T. Anekawa, C. Zhang, and H. Ohno, Nature Nanotechnology, DOI:10.1038/NNANO.2016.29). In order to apply an external magnetic field, a generation source of an external magnetic field is necessary.

SUMMARY OF THE DISCLOSURE

When a generation source of an external magnetic field is separately provided, a size of an element increases and a manufacturing process becomes complicated. Although magnetization rotation can be performed without applying an external magnetic field in accordance with a constitution of an element, there is a problem that it takes time to perform magnetization rotation.

The present disclosure was made in view of the above-described problems and an objective of the present disclosure is to provide a spin-orbit-torque magnetization rotational element capable of easily converting a magnetization direction even under conditions in which no external magnetic field is applied.

A magnetic memory is formed by integrating a plurality of fine magnetoresistance effect elements having a diameter of several tens of nm to several hundred nm. A magnetic memory is required to have high integration. In view of integration and processing accuracy, when an x direction and a y direction in which two dimensions are defined are determined, it is desirable for all processes to proceed in the two directions. For example, also in a technique such as semiconductor photolithography, a process having a component in an oblique direction with respect to the defined x direction and y direction is not usually performed.

On the other hand, as a result of intensive research, the inventors of the present disclosure found that it is possible to easily change a magnetization direction even under conditions in which an external magnetic field is not applied by extending a spin-orbit torque wiring in an oblique direction with respect to the defined x direction and y direction.

That is to say, the present disclosure provides the following means to solve the above-described problems.

(1) A spin-orbit-torque magnetization rotational element according to a first aspect includes: a first wiring which extends in a first direction; a second wiring which extends in the first direction or a second direction orthogonal to the first direction; a spin-orbit torque wiring which is electrically connected to the first wiring and the second wiring and extends in a third direction intersecting both of the first direction and the second direction in a plan view; and a first ferromagnetic layer which is laminated on a surface of the spin-orbit torque wiring and has an easy axis of magnetization in the first direction or the second direction.

(2) In the spin-orbit-torque magnetization rotational element according to the above-described aspect, a shape of the first ferromagnetic layer in a plan view may be a parallelogram having an acute angle at its corners.

(3) In the spin-orbit-torque magnetization rotational element according to the above-described aspect, the spin-orbit-torque magnetization rotational element includes: a first via wiring configured to connect the first wiring to a first end portion of the spin-orbit torque wiring; and a second via wiring configured to connect the second wiring to a second end portion of the spin-orbit torque wiring, wherein widths of the first via wiring and the second via wiring are wider than a width of the spin-orbit torque wiring.

(4) In the spin-orbit-torque magnetization rotational element according to the above-described aspect, the first ferromagnetic layer may be formed of a HoCo alloy, a SmFe alloy, an FePt alloy, a CoPt alloy, or a CoCrPt alloy.

(5) A spin-orbit-torque magnetoresistance effect element according to a second aspect includes the spin-orbit-torque magnetization rotational element according to the above-described aspect; a second ferromagnetic layer located on a side of the first ferromagnetic layer opposite to the spin-orbit torque wiring; and a non-magnetic layer sandwiched between the first ferromagnetic layer and the second ferromagnetic layer.

(6) In the spin-orbit-torque magnetoresistance effect element according to the above-described aspect, the first ferromagnetic layer may further include a diffusion prevention layer configured to prevent diffusion of an element.

(7) In the spin-orbit-torque magnetoresistance effect element according to the above-described aspect, the diffusion prevention layer may include a non-magnetic heavy metal element.

(8) In the spin-orbit-torque magnetoresistance effect element according to the above-described aspect, a thickness of the diffusion prevention layer may be at least twice a diameter of the element constituting the diffusion prevention layer.

(9) A magnetic memory according to a third aspect includes a plurality of spin-orbit-torque magnetoresistance effect elements according to the above-described aspect.

According to the spin-orbit-torque magnetization rotational element associated with the above-described aspect, it is possible to easily change a magnetization direction even under conditions in which no external magnetic field is applied.

DETAILED DESCRIPTION OF THE DISCLOSURE

Figure 1:
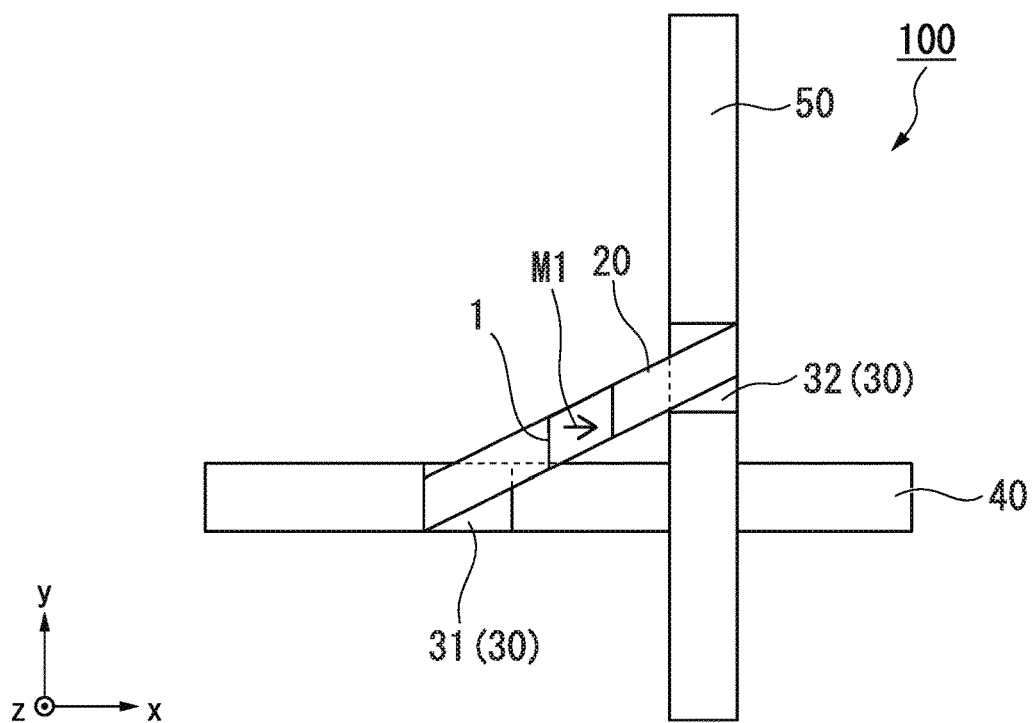
FIG. 1 is a plan view schematically illustrating a spin-orbit-torque magnetization rotational element according to a first embodiment.

Embodiments will be described in detail below by appropriately referring to the drawings. In the drawings used in the following description, enlarged characteristic portions are illustrated in some cases for the sake of convenience so that the characteristics of the present disclosure can be easily understood and thus dimensional proportions and the like of respective constituent elements may be different from the actual sizes in some cases. Materials and dimensions exemplified in the following description are merely examples and the present disclosure is not limited thereto. Modifications within the range in which the effects of the present disclosure can be achieved are also possible.

FIG. 1 is a plan view schematically illustrating a spin-orbit-torque magnetization rotational element according to a first embodiment. A spin-orbit-torque magnetization rotational element 100 illustrated in FIG. 1 includes a first ferromagnetic layer 1, a spin-orbit torque wiring 20, a via wiring 30, a first wiring 40, and a second wiring 50.

In FIG. 1, it is assumed that a first direction in which the first wiring 40 extends is an x direction, a second direction orthogonal to the first direction in a plan view is a y direction, and a direction orthogonal to both of the x direction and the y direction toward the front of the paper surface is a z direction.

<First Wiring and Second Wiring>

The first wiring 40 extends in the x direction and the second wiring 50 extends in the y direction. The first wiring 40 and the second wiring 50 are located at different heights in the z direction and are not directly connected to each other. When a current flows between the first wiring 40 and the second wiring 50, a current flows through the spin-orbit torque wiring 20. It is possible to use a material with high conductivity for the first wiring 40 and the second wiring 50. For example, copper, aluminum, or the like can be used.

<Spin-Orbit Torque Wiring>

The spin-orbit torque wiring 20 extends in a third direction intersecting both of the x direction and the y direction in a plan view. The third direction is an oblique direction with respect to the x direction and the y direction. That is to say, the first direction, the second direction, and the third direction are drawn as different directions on the same plane when projected onto an xy plane.

The spin-orbit torque wiring 20 is made of a material in which a spin current is generated due to a spin Hall effect when a current flows therethrough. Any material is constituted to generate a spin current in the spin-orbit torque wiring 20 may be adopted as such a material. Therefore, the material is not limited to a material made of a single element and may be a material including a portion constituted of a material that easily generates a spin current and a portion constituted of a material that does not easily generate a spin current.

A spin Hall effect is a phenomenon in which a spin current is induced in a direction orthogonal to a current direction on the basis of a spin orbit interaction when a current has flowed through a material. A mechanism by which a spin current is generated due to a spin Hall effect will be described.

When a potential difference is applied to both ends of the spin-orbit torque wiring 20, a current flows through the spin-orbit torque wiring 20. When a current flows, a first spin S1 oriented in one direction and a second spin S2 oriented in a direction opposite that of the first spin S1 are each bent in a direction orthogonal to that of the current. For example, the first spin S1 is bent in the z direction with respect to a traveling direction and the second spin S2 is bent in a −z direction with respect to the traveling direction.

A normal Hall effect and a spin Hall effect are the same in that traveling (moving) charges (electrons) are bent in a traveling (moving) direction. On the other hand, a normal Hall effect and a spin Hall effect significantly differ in that, in the normal Hall effect, the traveling direction of charged particles traveling in a magnetic field is bent under a Lorentz force, whereas in the spin Hall effect, a traveling direction of a spin is bent when electrons merely travel (when a current merely flows) even when there is no magnetic field.

Since the number of electrons in the first spin S1 is equal to the number of electrons in the second spin S2 in a non-magnetic material (a material which is not a ferromagnetic material), the number of electrons in the first spin S1 directed in a +z direction is equal to the number of electrons in the second spin S2 directed in the −z direction in the drawings. In this case, charge flows cancel each other and an amount of current is zero. A spin current without current is particularly referred to as a pure spin current.

If an electron flow of the first spin S1 is represented by $J_\uparrow$, an electron flow of the second spin S2 is represented by $J_\downarrow$, and a spin current is represented by $J_S$, $J_S=J_\uparrow-J_\downarrow$ is defined. The spin current $J_S$ flows in the z direction in the drawings. In FIG. 1, the first ferromagnetic layer 1 which will be described later is present above an upper surface of the spin-orbit torque wiring 20. For this reason, spins are injected into the first ferromagnetic layer 1.

The spin-orbit torque wiring 20 is formed of any of a metal, an alloy, an intermetallic compound, a metal boride, a metal carbide, a metal silicide, and a metal phosphide having a function of generating a spin current due to a spin Hall effect when a current flows therethrough.

It is desirable that a main constitution of the spin-orbit torque wiring 20 include a non-magnetic heavy metal. Here, the term "heavy metal" refers to a metal having a specific gravity equal to or higher than that of yttrium. Non-magnetic heavy metals are preferably non-magnetic metals which have d electrons or f electrons in the outermost shell and have a high atomic number equal to higher than an atomic number of 39. These non-magnetic metals have a large spin orbit interaction that causes a spin Hall effect.

Electrons generally travel in a direction opposite that of a current regardless of their spin direction. On the other hand, non-magnetic metals which have d electrons or f electrons in the outermost shell and have a large atomic number have a large spin orbit interaction and a strongly acting spin Hall effect. For this reason, a traveling direction of electrons depends on orientation of electron spin. Therefore, a spin current $J_S$ is easily generated in these non-magnetic heavy metals.

Also, the spin-orbit torque wiring 20 may include a magnetic metal. A magnetic metal is a ferromagnetic metal or an antiferromagnetic metal. A small amount of a magnetic metal is a scattering factor of spins when contained in a non-magnetic metal. When spins are scattered, a spin orbit interaction is increased and spin current generation efficiency with respect to a current is increased. A main constitution of the spin-orbit torque wiring 20 may include only an antiferromagnetic metal.

On the other hand, when an amount of a magnetic metal to be added is excessively increased, a generated spin current is scattered due to the added magnetic metal, and as a result, an action of reducing a spin current increases in some cases. For this reason, it is desirable that a molar ratio of a magnetic metal to be added be sufficiently smaller than a total molar ratio of elements constituting a spin-orbit torque wiring. A molar ratio of a magnetic metal to be added is preferably 3% or less.

The spin-orbit torque wiring 20 may include a topological insulator. A topological insulator is a substance in which the inside is made of an insulator or a high resistance substance and a spin-polarized metal state occurs on a surface thereof. This substance has an internal magnetic field caused by a spin orbit interaction. Thus, a new topological phase appears due to an effect of a spin orbit interaction even when no external magnetic field is present. This is a topological insulator and it can generate a pure spin current with high efficiency due to a strong spin orbit interaction and breakdown of rotational symmetry at an edge.

As topological insulators, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like are desirable. These topological insulators can generate a spin current with high efficiency.

<First Ferromagnetic Layer>

The first ferromagnetic layer 1 is laminated on a surface of the spin-orbit torque wiring 20. The first ferromagnetic layer 1 may be directly connected to the spin-orbit torque wiring 20 and may be connected to the spin-orbit torque wiring 20 via another layer such as an underlying layer.

The first ferromagnetic layer 1 is an in-plane magnetization film having axes of easy magnetization in the x direction or the y direction. As a material of the first ferromagnetic layer 1, a ferromagnetic material, particularly, a soft magnetic material can be applied. The first ferromagnetic layer 1 illustrated in FIG. 1 has an easy axis of magnetization in the x direction. A magnetization direction of a magnetization M1 in the first ferromagnetic layer 1 changes. In a state in which no external force is applied, the magnetization M1 is oriented in an easy magnetization direction (+x or −x direction).

In an angle formed by the easy axis of magnetization of the magnetization M1 and the third direction in which the spin-orbit torque wiring 20 extends, a preferable range changes due to the performance required for the spin-orbit-torque magnetization rotational element 100. When shortening of a time at which a magnetization starts to rotate is desired (manufacturing of an element having excellent reactivity is desired), an angle formed by the easy axis of magnetization and the third direction is preferably 45° or less, more preferably 30° or less, and further more preferably 10° or less. When it is desired to increase the stability of magnetization rotation (to prepare an element having excellent reliability), an angle formed by the easy axis of magnetization and the third direction is 45° or more, more preferably 60° or more, and further more preferably 80° or more.

The first ferromagnetic layer 1 is preferably made of a tetragonal magnetic material in which a c-axis length is shorter than an a-axis length. For example, it is desirable to use a Co—Ho alloy ($CoHo_2$), a Sm—Fe alloy ($SmFe_{12}$), an FePt alloy, a CoPt alloy, a CoCrPt alloy, and the like. It should be noted that, even when a c-axis length is longer than an a-axis length, an orientation direction of the magnetization M1 can be controlled by applying a magnetic field in a predetermined direction at the time of film formation or annealing.

Figure 2:
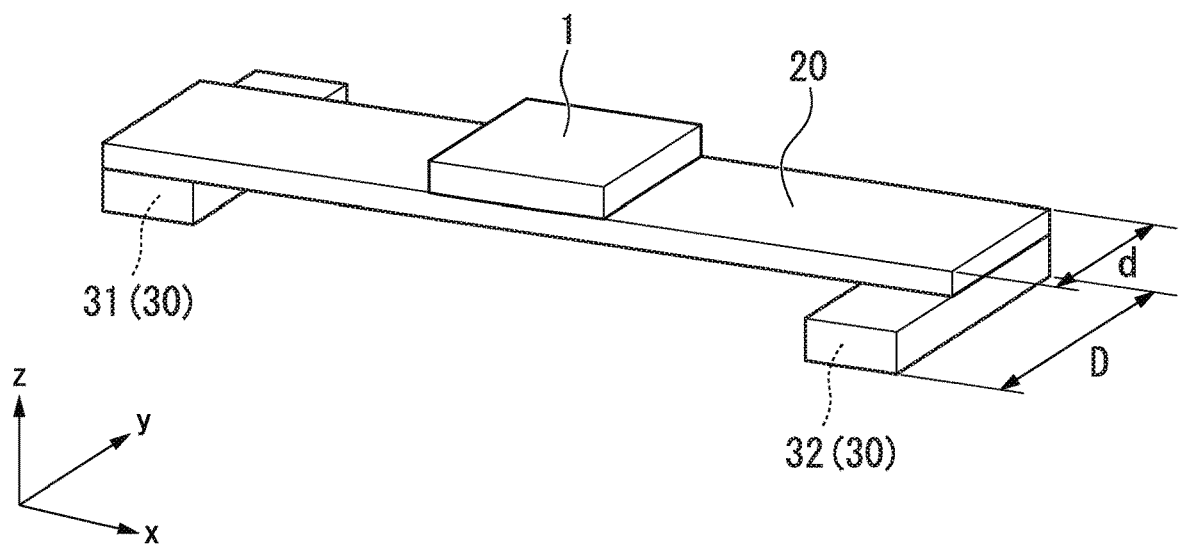
FIG. 2 is an enlarged perspective view of a main part in the spin-orbit-torque magnetization rotational element according to the first embodiment.
Figure 3:
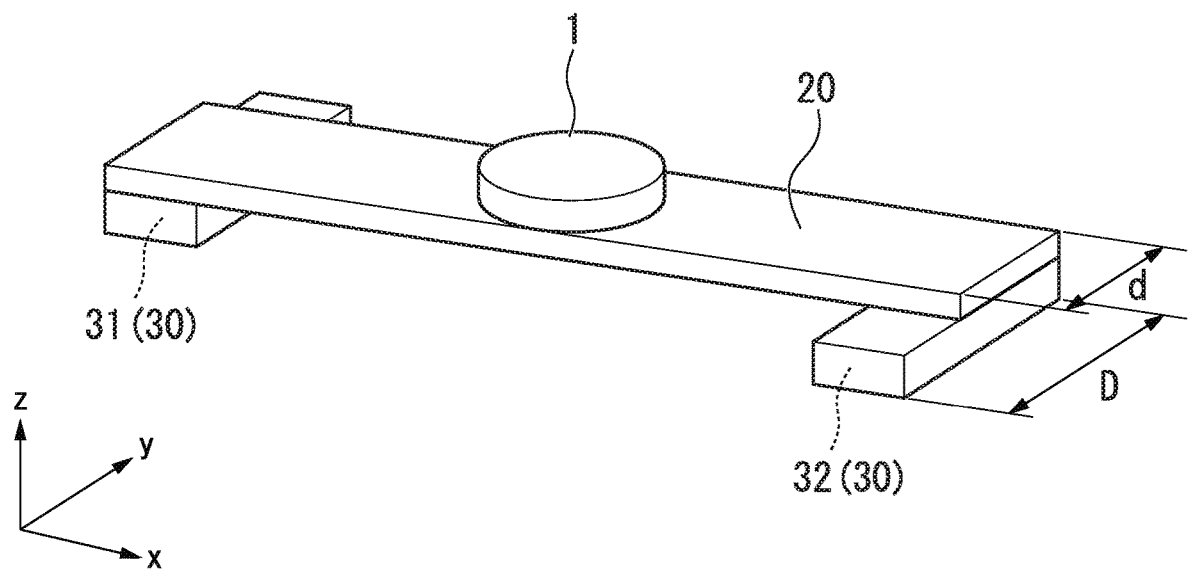
FIG. 3 is an enlarged perspective view of the main part in the spin-orbit-torque magnetization rotational element according to the first embodiment.

As described above, it is possible to freely control the orientation direction of the magnetization M1 using a direction of a magnetic field applied at the time of film formation or annealing. For this reason, a shape of the first ferromagnetic layer 1 in a plan view is not particularly limited. For example, a parallelogram having an acute angle at its corners may be used as illustrated in FIGS. 1 and 2 and a circular shape may be used as illustrated FIG. 3. FIGS. 2 and 3 are enlarged perspective views of a main part of an example of the spin-orbit-torque magnetization rotational element according to the first embodiment. As illustrated in FIG. 2, when the shape of the first ferromagnetic layer 1 in a plan view is the parallelogram having the acute angle at its corners, the plane symmetry is poor. Thus, portions at which a demagnetization field is locally weak is formed are corner portions or the like. The portions at which the demagnetization field is weak are easily subjected to magnetization rotation. In other words, the magnetization of this portion is reversed and propagates to other portions (for example, the movement of a magnetization wall) so that energy required for magnetization rotation can be reduced. Therefore, the shape of the first ferromagnetic layer 1 in a plan view is preferably a parallelogram (including a diamond shape) having an acute angle at its corners in view of easiness of magnetization rotation.

As illustrated in FIGS. 1 and 2, when the first ferromagnetic layer 1 has shape anisotropy, a long axis direction of the first ferromagnetic layer 1 is different from a direction of the easy axis of magnetization of the first ferromagnetic layer 1. In this case, the direction of the easy axis of magnetization of the magnetization M1 of the first ferromagnetic layer 1 can be obtained, for example, by the following methods.

In a first method, a plurality of first ferromagnetic layers 1 prepared under the same conditions are arranged and their magnetic properties are measured. Magnetic properties can be measured using a vibrating sample type magnetometer (VSM), a superconducting quantum interferometer (SQUID), a physical property measuring device (PPMS), or the like.

First, the plurality of first ferromagnetic layers 1 whose long axes are aligned in one direction are arranged, for example, in an array form. Moreover, a constant magnetic field is applied to an element aggregate of the first ferromagnetic layers 1 from a predetermined direction (reference direction) in an xy plane and the magnetization in a predetermined direction of the first ferromagnetic layer 1 is measured. The element aggregate exhibits measurable magnetization by collecting the plurality of first ferromagnetic layers 1. This work is performed at a plurality of points around the element aggregate in an in-plane direction while changing an angle at which a magnetic field is applied.

When the magnitude of magnetization in a predetermined direction is plotted on a vertical axis and an inclined angle from a reference direction of a magnetic field applied to the element aggregate is plotted on a horizontal axis, the magnetization characteristics of the element aggregate are obtained. When the first ferromagnetic layers 1 have an isotropic shape in the xy plane (for example, a circular shape in a plan view), magnetization characteristics to be measured draw a sine curve. Furthermore, when the first ferromagnetic layers 1 have long axes in one direction and directions of the axes of easy magnetization of the first ferromagnetic layers 1 coincide with a long axis direction of the first ferromagnetic layers 1, a shape of the sine curve (an inclined angle at each point of a graph) changes but an inclined angle indicating maximum magnetization is identical with the case of an isotropic shape. On the other hand, when the first ferromagnetic layers 1 have long axes in one direction and directions of the axes of easy magnetization of the first ferromagnetic layer 1 are different from a long axis direction of the first ferromagnetic layers 1, a shape of the sine curve (an inclined angle at each point of a graph) changes and an inclined angle indicating maximum magnetization is shifted. That is to say, it can be seen that, when an inclined angle with respect to a reference direction at a position in which magnetization peaks is different from an inclined angle with respect to a reference direction of a long axis direction of the first ferromagnetic layers 1 in a graph, the long axis direction of the first ferromagnetic layers 1 is different from a direction of the axes of easy magnetization of the first ferromagnetic layers 1.

Also, a second method is a method of performing measurement while applying a resistance value of the spin-orbit-torque magnetization rotational element 100 to the spin-orbit-torque magnetization rotational element 100. The resistance value of the spin-orbit-torque magnetization rotational element 100 is measured while changing an angle at which a constant magnetic field is applied from a predetermined direction (reference direction) in an xy plane. The resistance value of the spin-orbit-torque magnetization rotational element 100 is a resistance value between an upper surface of the first ferromagnetic layer 1 and an end of the spin-orbit torque wiring 20 and is mainly a resistance value of the first ferromagnetic layer 1.

When the resistance value of the spin-orbit-torque magnetization rotational element 100 is plotted on a vertical axis and an inclined angle from a reference direction of a magnetic field applied to the first ferromagnetic layer 1 is plotted on a horizontal axis, the resistance characteristics of the spin-orbit-torque magnetization rotational element 100 are obtained. The resistance characteristics show the same behavior as the above-described magnetization characteristics. When the first ferromagnetic layer 1 has an isotropic shape in the xy plane (for example, a circular shape in a plan view), the resistance characteristics to be measured draw a sine curve. Furthermore, when the first ferromagnetic layer 1 has a long axis in one direction and the direction of the axes of easy magnetization of the first ferromagnetic layers 1 coincides with the long axis direction of the first ferromagnetic layer 1, a shape of the sine curve (an inclined angle at each point of the graph) changes, but an inclined angle indicating a maximum resistance value coincides with that in the case of an isotropic shape. On the other hand, when the first ferromagnetic layer 1 has a long axis in one direction and the direction of the axes of easy magnetization of the first ferromagnetic layer 1 is different from the long axis direction of the first ferromagnetic layer 1, a shape of a sine curve (an inclined angle at each point of the graph) changes and an inclined angle indicating a maximum magnetization is shifted. That is to say, it can be seen that, when an inclined angle with respect to a reference direction at a position in which a resistance value peaks is different from an inclined angle with respect to a reference direction of the long axis direction of the first ferromagnetic layer 1 in a graph, the long axis direction of the first ferromagnetic layer 1 is different from the direction of the axes of easy magnetization of the first ferromagnetic layer 1.

<Via Wiring>

The via wiring 30 is constituted of two wirings, i.e., a first via wiring 31 and a second via wiring 32. The first via wiring 31 connects the first wiring 40 to a first end portion of the spin-orbit torque wiring 20. The second via wiring 32 connects the second wiring 50 to a second end portion of the spin-orbit torque wiring 20. The first via wiring 31 and the second via wiring 32 are located at positions in which the first via wiring 31 and the second via wiring 32 sandwich the first ferromagnetic layer 1 in a plan view. The via wiring 30 illustrated in FIG. 1 extends in the −z direction from the spin-orbit torque wiring 20, but may extend in the +z direction from the spin-orbit torque wiring 20 in accordance with the positions of the first wiring 40 and the second wiring 50.

A material having excellent conductivity can be used for the via wiring 30. For example, copper, aluminum, silver, or the like can be used as the via wiring 30.

As illustrated in FIGS. 2 and 3, it is desirable that widths of the first via wiring 31 and the second via wiring 32 be wider than a width of the spin-orbit torque wiring 20. Here, the width of the spin-orbit torque wiring 20 refers to a width in a direction orthogonal to a direction of the first direction (x direction) or the second direction (y direction) in which a length of the spin-orbit torque wiring 20 is long. That is to say, in FIGS. 2 and 3, the length of the spin-orbit torque wiring 20 is long in the x direction and the width of the spin-orbit torque wiring 20 refers to a width in the y direction of the spin-orbit torque wiring 20.

It is desirable that a width D of the first via wiring 31 and the second via wiring 32 is twice or more a width d of the spin-orbit torque wiring 20. By satisfying this relationship, even when an element size is miniaturized to a minimum processing dimension F, it is easy to arrange the spin-orbit torque wiring 20 obliquely with respect to the x direction and the y direction. Furthermore, it is possible to reduce these resistance values by increasing areas of the first via wiring 31 and the second via wiring 32.

<Other Constitutions>

For example, a space between a wiring and a first ferromagnetic layer is protected by an interlayer insulating film in an actual element. A material that is the same as that used for a semiconductor device or the like can be used for the interlayer insulating film. For example, silicon oxide ($SiO_x$), silicon nitride ($SiN_x$), silicon carbide (SiC), chromium nitride (CrN), silicon carbonitride (SiCN), silicon oxynitride (SiON), aluminum oxide ($Al_2O_3$), zirconium oxide ($ZrO_x$), and the like may be used.

In addition, a substrate or the like may be provided as a support. A substrate preferably has excellent flatness, and for example, Si, AlTiC, and the like can be used as a material thereof.

(Principle of Spin-Orbit-Torque Magnetization Rotational Element)

Next, a principle of the spin-orbit-torque magnetization rotational element 100 will be described. Furthermore, the reason why the spin-orbit-torque magnetization rotational element 100 according to the embodiment can easily perform magnetization rotation without applying an external magnetic field will be described.

Figure 4:
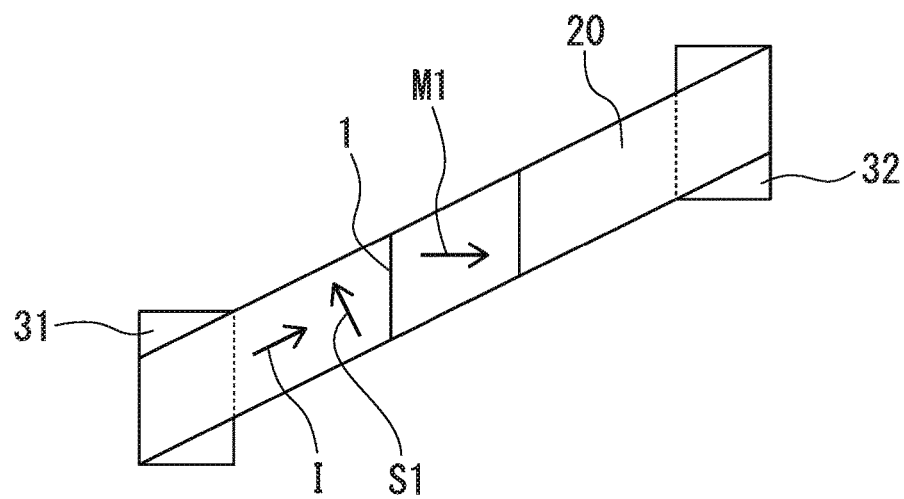
FIG. 4 is a schematic view for explaining the principle of the spin-orbit-torque magnetization rotational element according to the first embodiment.
Figure 5:
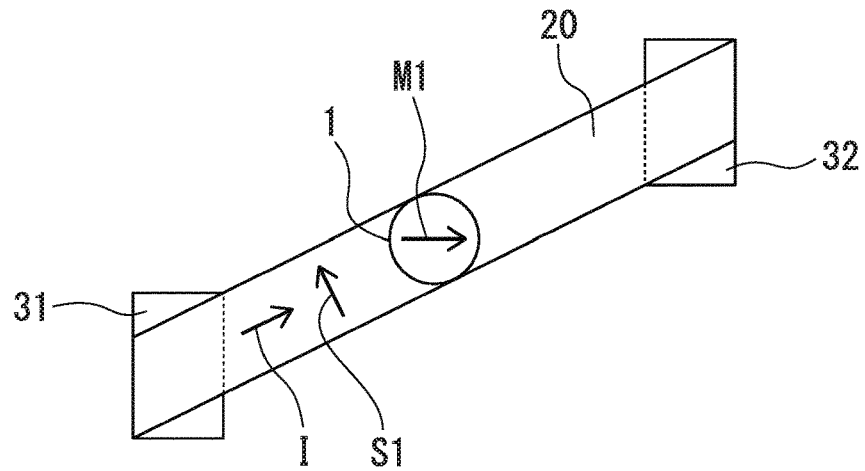
FIG. 5 is a schematic view for explaining the principle of the spin-orbit-torque magnetization rotational element according to the first embodiment using another example thereof.

FIGS. 4 and 5 are schematic views for explaining the principle of the spin-orbit-torque magnetization rotational element 100. A difference between FIGS. 4 and 5 is a difference between shapes in a plan view of the first ferromagnetic layer 1. The principles of the magnetization rotations are basically the same even when the shapes in the plan view of the first ferromagnetic layer 1 differ. When a potential difference is provided between the first wiring 40 and the second wiring 50, a writing current I flows through the spin-orbit torque wiring 20 configured to connect the first wiring 40 to the second wiring 50. When the writing current I flows through the spin-orbit torque wiring 20, a spin Hall effect occurs. The first spin S1 bent in the z direction is oriented in a direction orthogonal to that of the writing current I.

In the z direction of the spin-orbit torque wiring 20, the first ferromagnetic layers 1 are arranged. For this reason, spins are injected from the spin-orbit torque wiring 20 to the first ferromagnetic layers 1. The injected spins provide a spin orbit torque (SOT) to the magnetization M1 of the first ferromagnetic layer 1.

The first spin S1 injected into the first ferromagnetic layer 1 has a component in the x direction and a component in the y direction. The component in the y direction of the first spin S1 provides a torque (spin orbit torque) in the y direction to the magnetization M1 and rotates the magnetization M1 by 90° in the y direction. The component in the x direction of the first spin S1 provides a torque (spin orbit torque) in the −x direction which is 180° opposite to the magnetization M1 in the +x direction. That is to say, the magnetization M1 can be quickly rotated by 90° in the y direction with the component in the y direction of the first spin S1 and the magnetization M1 can be fully rotated in the −x direction with the component in the x direction of the first spin S1.

Figure 6:
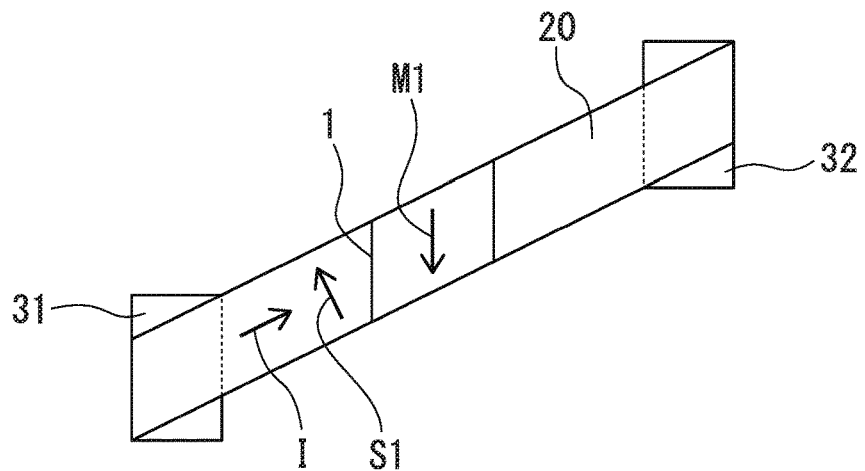
FIG. 6 is a schematic view for explaining the principle of the spin-orbit-torque magnetization rotational element according to the first embodiment using another example thereof.
Figure 7:
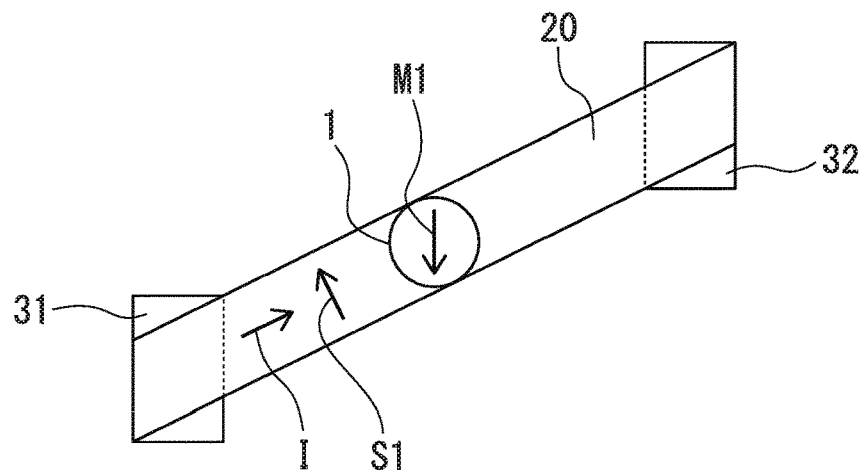
FIG. 7 is a schematic view for explaining the principle of the spin-orbit-torque magnetization rotational element according to the first embodiment using another example thereof.

Although the easy magnetization direction of the magnetization M1 of the first ferromagnetic layer 1 has been described as the x direction in FIGS. 4 and 5, as illustrated in FIGS. 6 and 7, the same applies to a case in which the easy magnetization direction of the magnetization M1 of the first ferromagnetic layer 1 is the y direction. A difference between FIGS. 6 and 7 is a difference between shapes in a plan view of the first ferromagnetic layer 1. The component in the x direction of the first spin S1 provides a torque (spin orbit torque) in the −x direction to the magnetization M1 and rotates the magnetization M1 by 90° in the −x direction. The component in the y direction of the first spin S1 provides a torque (spin orbit torque) in the y direction which is 180° opposite to the magnetization M1 in the −y direction. That is to say, the magnetization M1 can be quickly rotated by 90° in the −x direction with the component in the x direction of the first spin S1 and the magnetization M1 can be fully rotated in the y direction with the component in the y direction of the first spin S1.

Figure 8:
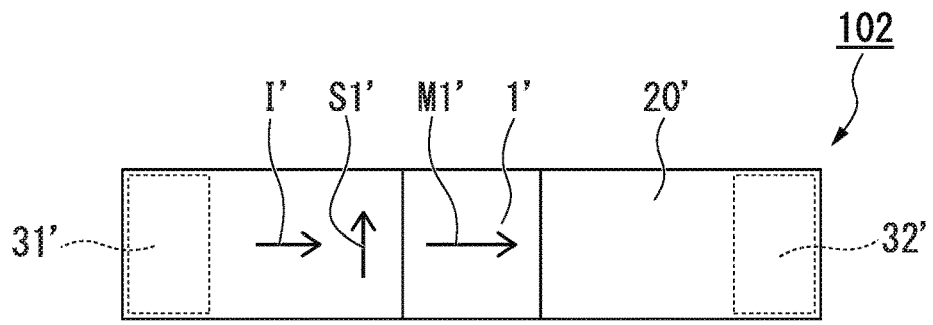
FIG. 8 is a schematic view of a spin-orbit-torque magnetization rotational element when a spin-orbit torque wiring extends in an x direction and is not inclined with respect to the x direction and a y direction.

FIG. 8 is a schematic view of a spin-orbit-torque magnetization rotational element 102 when a spin-orbit torque wiring 20' extends in the x direction and is not inclined with respect to the x direction and the y direction. An easy axis of magnetization of a first ferromagnetic layer 1' is the x direction and a magnetization M1' is oriented in the x direction. A first via wiring 31' and a second via wiring 32' sandwich the first ferromagnetic layer 1' in the x direction.

When a writing current I' flows through the spin-orbit torque wiring 20' illustrated in FIG. 8, a first spin S1' oriented in the y direction is injected into a first ferromagnetic layer 1'. Since the first spin S1' has only a component in the y direction, the magnetization M1 is rotated by 90° in the y direction. It is stochastically determined whether the magnetization M1 rotated by 90° returns in the x direction or is directed in the −x direction (subjected to magnetization rotation) in a state in which an external magnetic field is not applied to the first ferromagnetic layer 1. In other words, it is stochastically determined whether magnetization rotation is performed and the element does not function stably as an element.

As described above, in the spin-orbit-torque magnetization rotational element 100 according to the first embodiment, since the spin-orbit torque wiring 20 is arranged in an oblique direction with respect to the x direction and the y direction, it is possible to apply a torque for quickly rotating the magnetization M1 by 90° and a torque for reliably rotating the magnetization M1 by 180°. As a result, the spin-orbit-torque magnetization rotational element 100 according to the first embodiment can easily perform magnetization rotation without applying a magnetic field from the outside of the element.

The above-described spin-orbit-torque magnetization rotational element 100 according to the first embodiment can be applied to a nonvolatile random access memory (MRAM), a high frequency component, a magnetic sensor, and the like. For example, the spin-orbit-torque magnetization rotational element 100 can be used as a magnetic anisotropic sensor or an optical element using a magnetic Kerr effect or a magnetic Faraday effect.

Also, the spin-orbit-torque magnetization rotational element 100 according to the first embodiment can be manufactured by a known technique such as photolithography. In order to define the easy magnetization direction of the magnetization M1 of the first ferromagnetic layer 1, it is desirable to apply a magnetic field in a predetermined direction at the time of film formation or annealing.

While the embodiment has been described in detail above with reference to the drawings, the constitutions, a combination thereof, and the like in each embodiment are merely examples and additions, omissions, substitutions, and other modifications of the constitutions are possible without departing from the gist of the present disclosure.

Figure 9:
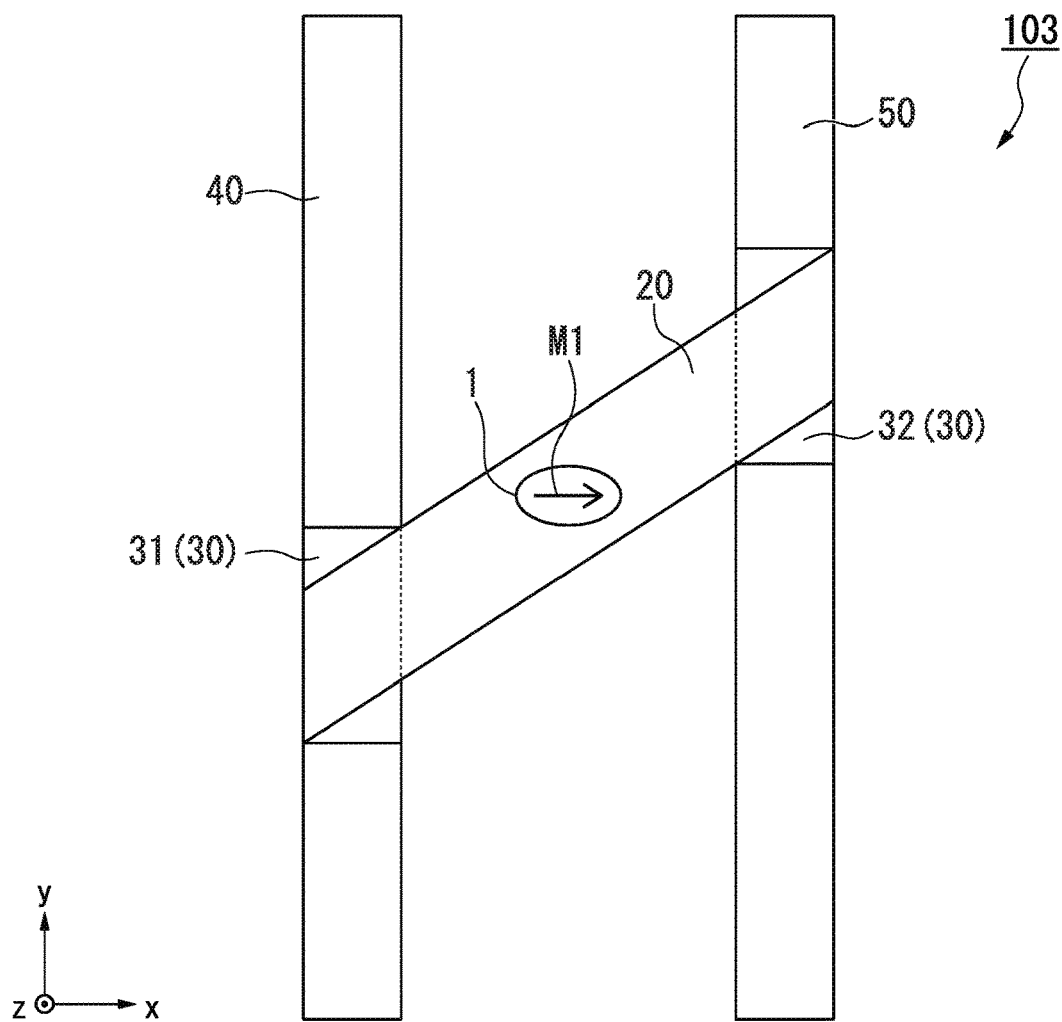
FIG. 9 is a schematic plan view of another example of the spin-orbit-torque magnetization rotational element according to the first embodiment.

For example, FIG. 9 is a schematic plan view of another example of the spin-orbit-torque magnetization rotational element according to the first embodiment. As illustrated in FIG. 9, extension directions of a first wiring 40 and a second wiring 50 in a spin-orbit-torque magnetization rotational element 103 are the same and may be arranged in parallel. Furthermore, as illustrated in FIG. 9, a shape of the first ferromagnetic layer 1 in a plan view may be elliptical.

Second Embodiment

<Spin-Orbit-Torque Magnetoresistance Effect Element>

Figure 10:
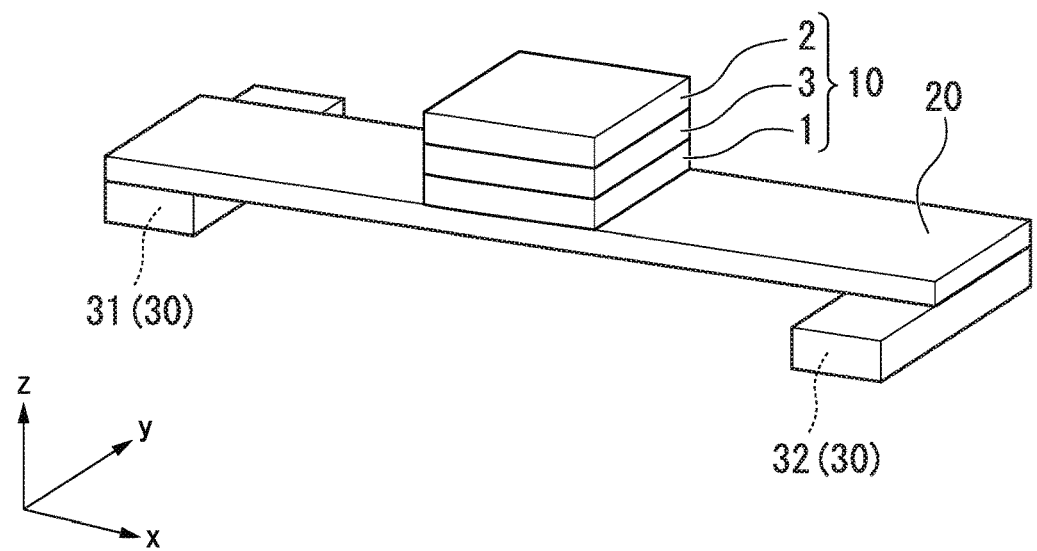
FIG. 10 is an enlarged perspective view of a main part of a spin-orbit-torque magnetoresistance effect element according to a second embodiment.

FIG. 10 is an enlarged perspective view of a main part of a spin-orbit-torque magnetoresistance effect element according to a second embodiment. The spin-orbit-torque magnetoresistance effect element includes the above-described spin-orbit-torque magnetization rotational element, a second ferromagnetic layer 2, and a non-magnetic layer 3. The second ferromagnetic layer 2 is located on an opposite side of a spin-orbit torque wiring 20 of a first ferromagnetic layer 1. A non-magnetic layer 3 is sandwiched between the first ferromagnetic layer 1 and the second ferromagnetic layer 2. A magnetoresistance effect element 10 is formed of the first ferromagnetic layer 1, the non-magnetic layer 3, and the second ferromagnetic layer 2. A plan view of the spin-orbit-torque magnetoresistance effect element is the same as that in the first embodiment except that the first ferromagnetic layer 1 is substituted with the magnetoresistance effect element 10. Constituent elements that are the same as those of the above-described spin-orbit-torque magnetization rotational element 100 will be denoted by the same reference numerals and description thereof will be omitted.

The magnetoresistance effect element 10 functions when the magnetization of the second ferromagnetic layer 2 is fixed in one direction (z direction) and a direction of a magnetization M1 of the first ferromagnetic layer 1 relatively changes. When the magnetoresistance effect element 10 is applied to a coercivity-differed type (pseudo spin valve type) MRAM, the coercivity of the second ferromagnetic layer 2 is larger than the coercivity of the first ferromagnetic layer 1. When the magnetoresistance effect element 10 is applied to an exchange bias type (spin valve type) MRAM, the magnetization of the second ferromagnetic layer 2 is fixed through exchange coupling with an antiferromagnetic layer.

Also, the magnetoresistance effect element 10 has the same constitution as a tunneling magnetoresistance (TMR) element when the non-magnetic layer 3 is constituted of an insulator and has the same constitution as a giant magnetoresistance (GMR) element when the non-magnetic layer 3 is constituted of a metal.

A known laminated structure of the magnetoresistance effect element can be adopted as a laminated structure of the magnetoresistance effect element 10. For example, each layer may be formed of a plurality of layers and may include another layer such as an antiferromagnetic layer for fixing a magnetization direction of the second ferromagnetic layer 2. The second ferromagnetic layer 2 is referred to as a fixed layer or a reference layer and the first ferromagnetic layer 1 is referred to as a free layer, a memory layer, or the like.

A known material can be used for a material of the second ferromagnetic layer 2 and a material that is the same as that of the first ferromagnetic layer 1 can be used for such a material. Since the first ferromagnetic layer 1 is an in-plane magnetization film, it is desirable that the second ferromagnetic layer 2 be also an in-plane magnetization film.

In order to further increase the coercivity of the second ferromagnetic layer 2 with respect to the first ferromagnetic layer 1, an antiferromagnetic material such as IrMn and PtMn may be used as a material in contact with the second ferromagnetic layer 2. In addition, in order to prevent a leakage magnetic field of the second ferromagnetic layer 2 from affecting the first ferromagnetic layer 1, a structure of synthetic ferromagnetic coupling may be adopted.

A known material can be used for the non-magnetic layer 3.

For example, when the non-magnetic layer 3 is constituted of an insulator (in the case of a tunnel barrier layer), $Al_2O_3$, $SiO_2$, $MgO$, $Ga_2O_3$, $MgAl_2O_4$, and the like can be used as a material thereof. In addition to this, a material in which a part of Al, Si, and Mg is substituted with Zn, Be, or the like can also be used. Furthermore, a material in which Mg in $MgAl_2O_4$ is substituted with Zn, a material in which Al is substituted with Ga or In, and the like can also be used. Among them, MgO and $MgAl_2O_4$ have high lattice matching with other layers.

In order to obtain a high magnetic resistance ratio, the magnetoresistance effect element 10 is preferably a TMR element. That is to say, the non-magnetic layer 3 is preferably a tunnel barrier layer. A MgO or a non-magnetic spinel material is desirable as a tunnel barrier material. Furthermore, at least one of the first ferromagnetic layer 1 and the second ferromagnetic layer 2 is preferably an alloy including any one of Co and Fe and an alloy including any one of Co and Fe and B. In this case, the non-magnetic layer 3 is easily crystallized and a high magnetic resistance ratio is obtained.

The magnetoresistance effect element 10 may include another layer. For example, an underlying layer may be provided on a surface of the first ferromagnetic layer 1 opposite to the non-magnetic layer 3 and a cap layer may be provided on a surface of the second ferromagnetic layer 2 opposite to the non-magnetic layer 3.

It is desirable that a layer arranged between the spin-orbit torque wiring 20 and the first ferromagnetic layer 1 does not scatter spins propagating from the spin-orbit torque wiring 20. For example, it is known that silver, copper, magnesium, aluminum, and the like have a spin diffusion length of 100 nm or longer and are less likely to scatter spins.

Also, a thickness of this layer is preferably a spin diffusion length or less of a material constituting the layer. When the thickness of the layer is the spin diffusion length or less, it is possible to sufficiently transfer spins propagating from the spin-orbit torque wiring 20 to the first ferromagnetic layer 1.

The first ferromagnetic layer 1 may have a diffusion prevention layer which prevents diffusion of elements. The diffusion prevention layer may be provided on a surface of the first ferromagnetic layer 1 on the non-magnetic layer 3 side and may be provided on any portion of the first ferromagnetic layer 1 in a thickness direction. When the diffusion prevention layer is provided on any portion of the first ferromagnetic layer 1 in the thickness direction, the first ferromagnetic layer has a three layer structure, i.e., a lower layer, a diffusion prevention layer, and an upper layer.

It is desirable that the diffusion prevention layer contain a non-magnetic heavy metal element. Furthermore, it is desirable that the diffusion prevention layer has a thickness which is twice or more of diameters of elements constituting the diffusion prevention layer. In the case of such a thickness, strictly, a heavy metal element is dotted in an island shape and a mixed layer of the upper layer or the lower layer and the heavy metal element serves as a diffusion prevention layer. By providing the diffusion prevention layer, it is possible to minimize the diffusion of elements from the inside of the first ferromagnetic layer 1 to the second ferromagnetic layer 2 even when annealing has been performed at a high temperature. By minimizing the diffusion of the elements, it is possible to prevent deterioration of the magnetic properties of the first ferromagnetic layer 1 and the second ferromagnetic layer 2.

The spin-orbit-torque magnetoresistance effect element stores information in accordance with the direction of the magnetization M1 of the first ferromagnetic layer 1. When data is written, a current flows through the spin-orbit torque wiring 20 (write operation). Since each of the spin-orbit torque wirings 20 is arranged in the oblique direction with respect to the x direction and the y direction, it is possible to apply a torque for quickly rotating the magnetization M1 by 90° and a torque for reliably rotating the magnetization M1 by 180° to the magnetization M1 of the first ferromagnetic layer 1. In other words, the spin-orbit-torque magnetization rotational element according to the second embodiment can easily perform magnetization rotation without applying a magnetic field from the outside of the element.

When data is read, a difference of a resistance value according to a difference of a relative angle between the magnetizations of the first ferromagnetic layer 1 and the second ferromagnetic layer 2 is measured by applying a current or a voltage in a lamination direction of the magnetoresistance effect element 10 (read operation). For example, a third wiring is connected to the second ferromagnetic layer 2 and a read current is applied between the third wiring and the first wiring 40 or the second wiring 50.

As described above, the spin-orbit-torque magnetoresistance effect element according to the embodiment can stably perform magnetization rotation without applying a magnetic field from the outside of the element. In other words, the spin-orbit-torque magnetoresistance effect element according to the embodiment stably functions as a recording element capable of recording and reading data. With regard to the other action effects, the same effect as that of the first embodiment can be obtained.

Third Embodiment

<Magnetic Memory>

Figure 11:
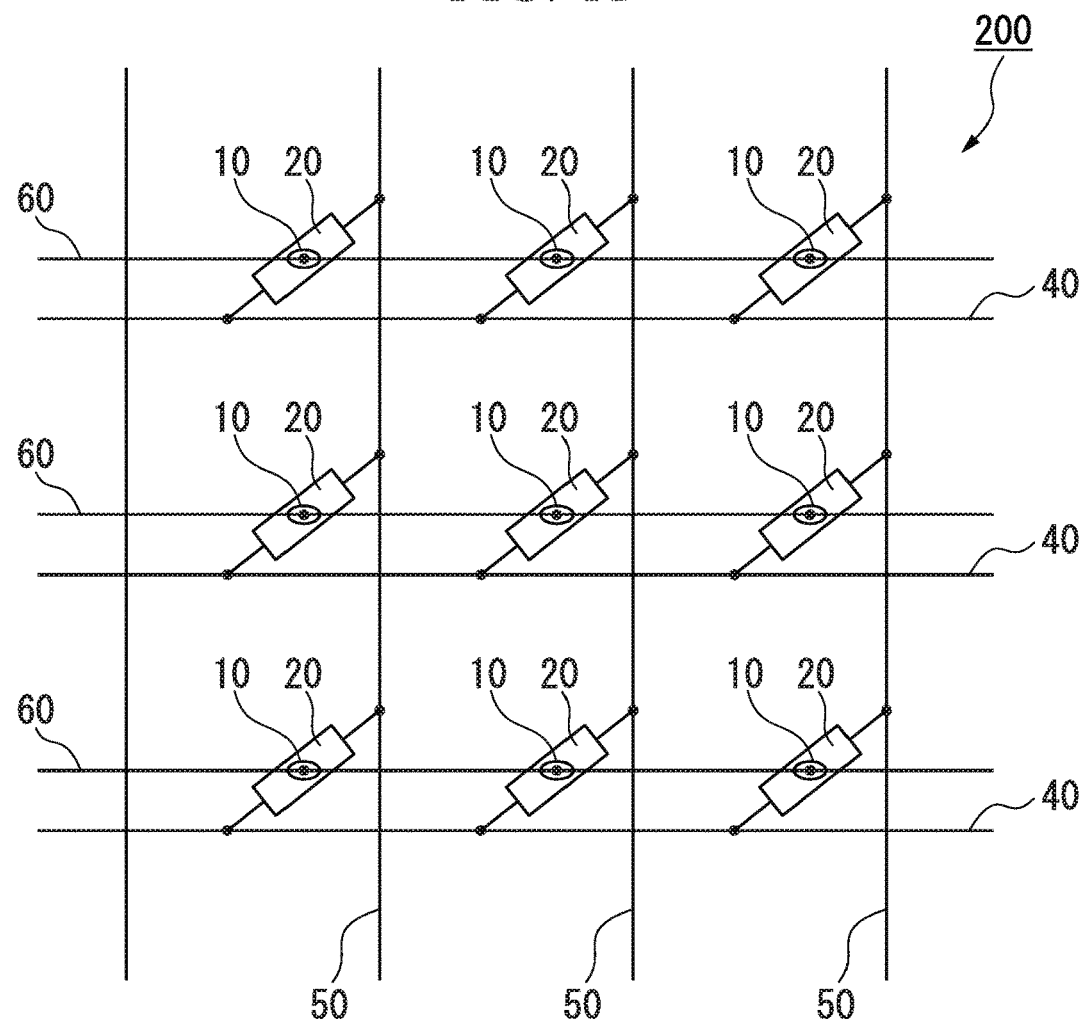
FIG. 11 is a plan view of a magnetic memory including a plurality of spin-orbit-torque magnetoresistance effect elements.

FIG. 11 is a plan view of a magnetic memory 200 including a plurality of spin-orbit-torque magnetoresistance effect elements. The magnetic memory 200 illustrated in FIG. 11 has a 3×3 matrix arrangement of the spin-orbit-torque magnetoresistance effect elements. FIG. 11 illustrates an example of a magnetic memory and the number and arrangement of the spin-orbit-torque magnetoresistance effect elements are arbitrary.

A first wiring 40 and a second wiring 50 are connected to each of the plurality of spin-orbit torque wirings 20. Furthermore, a third wiring 60 is connected to a second ferromagnetic layer 2 in a magnetoresistance effect element 10.

By selecting the first wiring 40 and the second wiring 50 to which a current is applied, it is possible to perform a write operation by flowing a current an arbitrary spin-orbit torque wiring 20. Furthermore, by selecting a third wiring 60 to which a current is applied and the first wiring 40 (or the second wiring 50) from which a current is discharged, it is possible to perform a read operation by flowing a current in a lamination direction of an arbitrary magnetoresistance effect element 10. The first wiring 40, the second wiring 50, and the third wiring 60 can be selected by a transistor or the like. In other words, in the magnetic memory 200 according to the embodiment, data can be written to an arbitrary magnetoresistance effect element 10 and data of the arbitrary magnetoresistance effect element 10 can be read.

EXPLANATION OF REFERENCES 1, 1' First ferromagnetic layer
2 Second ferromagnetic layer
3 Non-magnetic layer
10 Magnetoresistance effect element
20, 20' Spin-orbit torque wiring
30 Via wiring
31, 31' First via wiring
32, 32' Second via wiring
40 First wiring
50 Second wiring
100, 101, 102, 103 Spin-orbit-torque magnetization rotational element
200 Magnetic memory
I, I' Writing current
M1, M1' Magnetization
S1, S1' First spin

What is claimed is:

1. A spin-orbit-torque magnetization rotational element comprising:
   a first wiring which extends in a first direction;
   a second wiring which extends in the first direction or a second direction orthogonal to the first direction;
   a spin-orbit torque wiring which is electrically connected to the first wiring and the second wiring and extends in a third direction intersecting both of the first direction and the second direction in a plan view; and
   a first ferromagnetic layer which is laminated on a surface of the spin-orbit torque wiring and has an easy axis of magnetization in the first direction or the second direction.

2. The spin-orbit-torque magnetization rotational element according to claim 1, wherein a shape of the first ferromagnetic layer in a plan view is a parallelogram having an acute angle in a corner.

3. The spin-orbit-torque magnetization rotational element according to claim 1, comprising:
a first via wiring configured to connect the first wiring to a first end portion of the spin-orbit torque wiring; and
a second via wiring configured to connect the second wiring to a second end portion of the spin-orbit torque wiring,
wherein widths of the first via wiring and the second via wiring are wider than a width of the spin-orbit torque wiring.

4. The spin-orbit-torque magnetization rotational element according to claim 2, comprising:
a first via wiring configured to connect the first wiring to a first end portion of the spin-orbit torque wiring; and
a second via wiring configured to connect the second wiring to a second end portion of the spin-orbit torque wiring,
wherein widths of the first via wiring and the second via wiring are wider than a width of the spin-orbit torque wiring.

5. The spin-orbit-torque magnetization rotational element according to claim 1, wherein the first ferromagnetic layer is a HoCo alloy, a SmFe alloy, an FePt alloy, a CoPt alloy, or a CoCrPt alloy.

6. The spin-orbit-torque magnetization rotational element according to claim 2, wherein the first ferromagnetic layer is a HoCo alloy, a SmFe alloy, an FePt alloy, a CoPt alloy, or a CoCrPt alloy.

7. The spin-orbit-torque magnetization rotational element according to claim 3, wherein the first ferromagnetic layer is a HoCo alloy, a SmFe alloy, an FePt alloy, a CoPt alloy, or a CoCrPt alloy.

8. The spin-orbit-torque magnetization rotational element according to claim 4, wherein the first ferromagnetic layer is a HoCo alloy, a SmFe alloy, an FePt alloy, a CoPt alloy, or a CoCrPt alloy.

9. A spin-orbit-torque magnetoresistance effect element comprising:
the spin-orbit-torque magnetization rotational element according to claim 1;
a second ferromagnetic layer located on a side of the first ferromagnetic layer opposite to the spin-orbit torque wiring; and
a non-magnetic layer sandwiched between the first ferromagnetic layer and the second ferromagnetic layer.

10. A spin-orbit-torque magnetoresistance effect element comprising:
the spin-orbit-torque magnetization rotational element according to claim 2;
a second ferromagnetic layer located on a side of the first ferromagnetic layer opposite to the spin-orbit torque wiring; and
a non-magnetic layer sandwiched between the first ferromagnetic layer and the second ferromagnetic layer.

11. A spin-orbit-torque magnetoresistance effect element comprising:
the spin-orbit-torque magnetization rotational element according to claim 3;
a second ferromagnetic layer located on a side of the first ferromagnetic layer opposite to the spin-orbit torque wiring; and
a non-magnetic layer sandwiched between the first ferromagnetic layer and the second ferromagnetic layer.

12. A spin-orbit-torque magnetoresistance effect element comprising:
the spin-orbit-torque magnetization rotational element according to claim 4;
a second ferromagnetic layer located on a side of the first ferromagnetic layer opposite to the spin-orbit torque wiring; and
a non-magnetic layer sandwiched between the first ferromagnetic layer and the second ferromagnetic layer.

13. A spin-orbit-torque magnetoresistance effect element comprising:
the spin-orbit-torque magnetization rotational element according to claim 5;
a second ferromagnetic layer located on a side of the first ferromagnetic layer opposite to the spin-orbit torque wiring; and
a non-magnetic layer sandwiched between the first ferromagnetic layer and the second ferromagnetic layer.

14. A spin-orbit-torque magnetoresistance effect element comprising:
the spin-orbit-torque magnetization rotational element according to claim 6;
a second ferromagnetic layer located on a side of the first ferromagnetic layer opposite to the spin-orbit torque wiring; and
a non-magnetic layer sandwiched between the first ferromagnetic layer and the second ferromagnetic layer.

15. A spin-orbit-torque magnetoresistance effect element comprising:
the spin-orbit-torque magnetization rotational element according to claim 7;
a second ferromagnetic layer located on a side of the first ferromagnetic layer opposite to the spin-orbit torque wiring; and
a non-magnetic layer sandwiched between the first ferromagnetic layer and the second ferromagnetic layer.

16. A spin-orbit-torque magnetoresistance effect element comprising:
the spin-orbit-torque magnetization rotational element according to claim 8;
a second ferromagnetic layer located on a side of the first ferromagnetic layer opposite to the spin-orbit torque wiring; and
a non-magnetic layer sandwiched between the first ferromagnetic layer and the second ferromagnetic layer.

17. The spin-orbit-torque magnetoresistance effect element according to claim 9, wherein the first ferromagnetic layer further includes a diffusion prevention layer configured to prevent diffusion of an element.

18. The spin-orbit-torque magnetoresistance effect element according to claim 17, wherein the diffusion prevention layer contains a non-magnetic heavy metal element.

19. The spin-orbit-torque magnetoresistance effect element according to claim 17, wherein a thickness of the diffusion prevention layer is twice or more of a diameter of the element constituting the diffusion prevention layer.

20. A magnetic memory comprising a plurality of spin-orbit-torque magnetoresistance effect elements according to claim 9.

* * * * *